US007269194B2

(12) United States Patent
Diaz et al.

(10) Patent No.: US 7,269,194 B2
(45) Date of Patent: Sep. 11, 2007

(54) HIGH SPEED LASER ARRAY DRIVER

(75) Inventors: Nelson Diaz, Westminster, CO (US);
Michael Dudek, Broomfield, CO (US);
Carl Embry, Broomfield, CO (US)

(73) Assignee: Optical Communication Products, Inc., Woodland Hills, CA (US)

(*) Notice: Subject to any disclaimer, the term of this patent is extended or adjusted under 35 U.S.C. 154(b) by 121 days.

(21) Appl. No.: 11/179,140

(22) Filed: Jul. 12, 2005

(65) Prior Publication Data

US 2005/0271101 A1 Dec. 8, 2005

Related U.S. Application Data

(62) Division of application No. 10/936,083, filed on Sep. 8, 2004, now Pat. No. 6,973,107, which is a division of application No. 09/990,771, filed on Nov. 21, 2001, now Pat. No. 6,822,987.

(60) Provisional application No. 60/252,838, filed on Nov. 22, 2000.

(51) Int. Cl.
*H01S 3/00* (2006.01)

(52) U.S. Cl. .................. 372/38.02; 372/38.01
(58) Field of Classification Search ............. 372/38.02, 372/38.1, 38.07
See application file for complete search history.

(56) References Cited

U.S. PATENT DOCUMENTS

| 4,243,951 | A | * | 1/1981 | Wolkstein et al. ............. 372/26 |
| 4,636,744 | A | * | 1/1987 | King et al. .................. 330/295 |
| 5,073,730 | A | | 12/1991 | Hoffman ..................... 307/480 |
| 5,192,875 | A | * | 3/1993 | Kielmeyer, Jr. ............. 327/118 |
| 5,309,269 | A | | 5/1994 | Shibao ........................ 359/187 |
| 5,317,443 | A | | 5/1994 | Nishimoto ................... 359/187 |
| 5,373,387 | A | | 12/1994 | Bosch et al. ................. 359/187 |
| 5,521,527 | A | | 5/1996 | Sakata et al. ................. 326/21 |
| 5,526,164 | A | | 6/1996 | Link et al. ................... 359/187 |
| 5,802,089 | A | | 9/1998 | Link ............................ 372/38 |
| 6,016,326 | A | | 1/2000 | Claisse et al. ................ 372/44 |
| 6,647,040 | B2 | | 11/2003 | Dietrich et al. ........... 372/38.01 |
| 6,822,987 | B2 | | 11/2004 | Diaz et al. ................ 372/38.02 |
| 6,823,145 | B1 | * | 11/2004 | Shirai et al. ................. 398/182 |
| 2002/0018419 | A1 | | 2/2002 | Watabe ..................... 369/53.26 |

* cited by examiner

*Primary Examiner*—Minsun Oh Harvey
*Assistant Examiner*—Tuan N. Nguyen
(74) *Attorney, Agent, or Firm*—Barlow, Josephs & Holmes, Ltd.

(57) ABSTRACT

A method and apparatus for driving lasers. An example laser driving system includes a laser current controller for providing a modulation signal and a bias signal. The modulation signal and bias signal is used by a plurality of high-speed current drivers that accept the modulation signal and the bias signal and produce a plurality of laser drive signals. The example system also has a disable input that disconnects power from a high-speed current driver when the high-speed current driver is not in use. The exemplary system develops the modulation and bias signals by feeding back a signal developed from detection of laser light from one of the lasers driven by the system. The laser may be a data laser or a control laser that is modulated by a signal having a lower frequency than the data lasers. If a control laser is used then the photodetector circuit used for feedback can have a lower frequency response because of the lower frequency of the control laser signal. The photodetector system may also employ a peak detector capacitor discharge circuit where a large capacitance is simulated by having the capacitor discharge through the base of a transistor have a current source in the emitter circuit.

4 Claims, 13 Drawing Sheets

GENERAL CASE

LASER SIGNAL → PHOTO DIODE LPP →

HIGH BW, LOW CAPACITANCE PHOTODIODE

INPUT
OUTPUT

LOW BW, HIGH CAPACITANCE PHOTODIODE

INPUT
OUTPUT

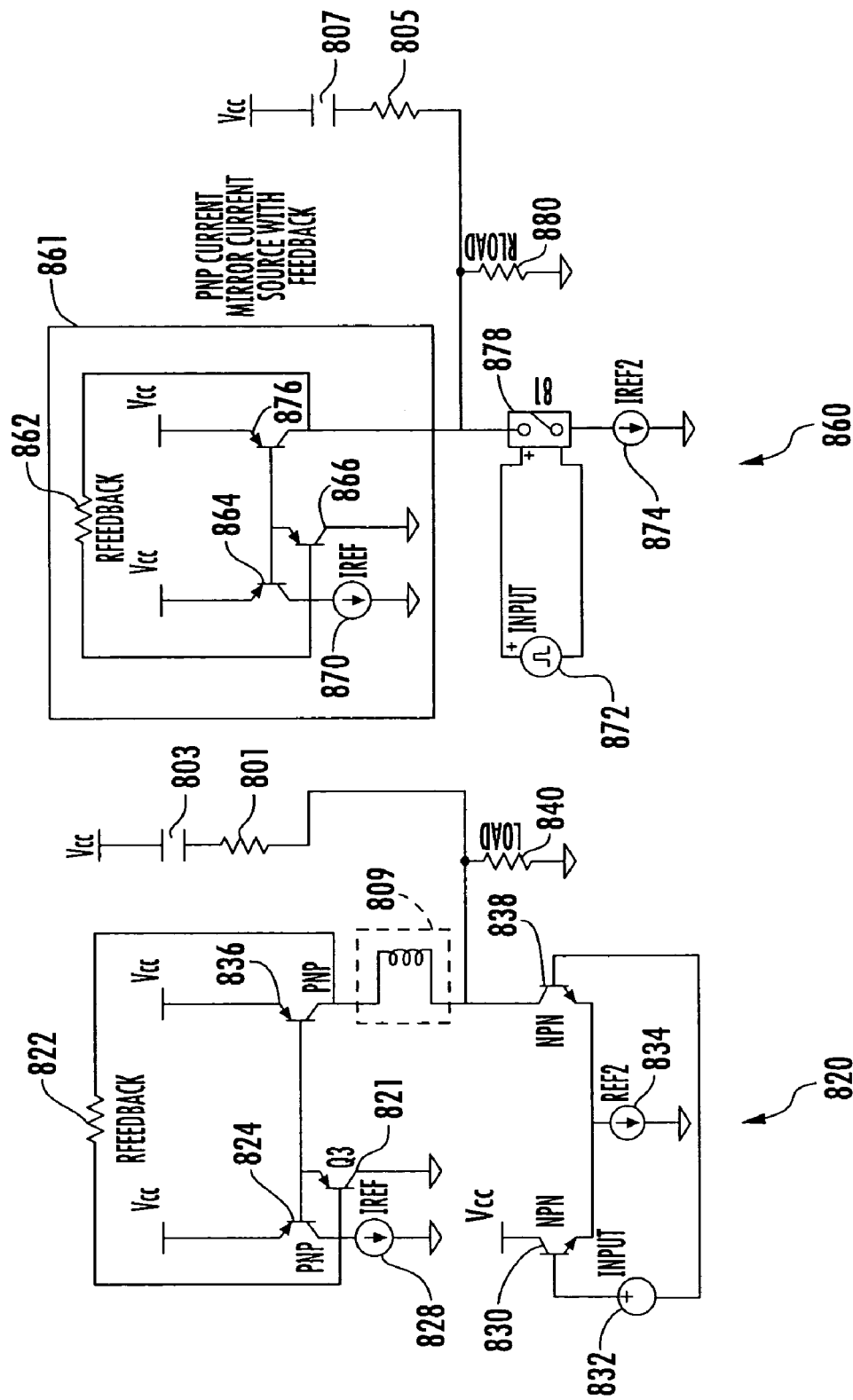

HIGH SPEED LASER ARRAY DRIVER

CROSS-REFERENCE TO RELATED APPLICATION(S)

This application is a division of U.S. patent application Ser. No. 10/936,083 filed Sep. 8, 2004 now U.S. Pat. No. 6,973,107, which is a division of U.S. patent application Ser. No. 09/990,771 filed Nov. 21, 2001 now U.S. Pat. No. 6,822,987, which claims the benefit under 35 U.S.C. § 119(e) to U.S. Provisional Patent Application Ser. No. 60/252,838 filed Nov. 22, 2000. The contents of the aforementioned patent applications are incorporated herein by reference.

FIELD OF THE INVENTION

The present invention relates most generally to the field of optical transmission of information. More particularly, the present invention relates to an integrated circuit apparatus and method for driving lasers to maintain desired optical of lasers while reducing power consumption.

BACKGROUND OF THE DISCLOSURE

In the field of telecommunications, lasers such as vertical cavity surface emitting lasers (VCSELs) and other optoelectronic devices are commonly used for the transmission of information along optical fibers and the like. VCSELs, in particular are especially desirable in today's optical communication systems because they are efficient, small in size, readily assembled into arrays, and easy to manufacture.

Within optical communication systems utilizing VCSELs or other lasers, it is often desirable to control the parameters of the optical data signal being transmitted. For example, it is often desirable to control average power and amplitude of the signal. If the average power $P_{ave}$ is maintained properly, the laser may be modulated about the average power bias point at a modulation level necessary to achieve desired high and low light output power levels, $P_{high}$ and $P_{low}$.

An optical modulation amplitude (OMA) and an extinction ratio (ER) of the laser, defined as $P_{high}-P_{low}$ and $P_{high}/P_{low}$, respectively, is commonly maintained within predetermined limiting values to maintain desired optical signal integrity. The limit values commonly are per specification such as the Synchronous Optical NETwork (SONET) or Gigabit Ethernet specification, or any other specification that the system is designed to meet.

Therefore, in order to obtain reliable and repeatable results in many fiber optic transmission applications, it is desirable to maintain both the average signal power and the OMA (or ER) within predetermined limit values. Unfortunately, laser characteristics change during the operation of the laser. In particular, as a laser such as a VCSEL is used to transmit optical data, the temperature of the operating laser and the environment which contains it, typically tends to increase, which may degrade laser performance. The OMA also changes as the temperature of the operating environment changes, and the change of the OMA with temperature is typically dependent on the particular laser used and the age of the particular laser. For example slope efficiency, a measure of optical output per current used to drive the laser, of the lasers may change due to temperature and age of the lasers. Automatic power control may be used to ameliorate these problems. Automatic power control is also used to account for laser threshold changes.

Similar to many other electronic systems, it is desirable to limit the power used by the laser drivers to drive the lasers. The limiting of the power used by the laser drivers to drive lasers result in reduction to power requirements and also reduces heat dissipation. Due to the reduced heat dissipation, the reduction in power requirements may also result in improvement of the laser performance due to reduced increase in temperature.

SUMMARY OF EMBODIMENTS OF THE INVENTION

In one embodiment of the present invention, a power down feature is provided to disable one or more unused lasers so as to reduce power dissipation.

In another embodiment, a dual feedback system is used to provide feedback signals for the adjustment of modulation and bias currents delivered to a single laser or each laser in a laser array through the respective laser drivers. In this manner, the dual feedback system may be used to maintain average optical power and Optical Modulation Amplitude (OMA) within predetermined limit values. The feedback signals may be provided by one of the data lasers or by an additional control laser that operates at a lower frequency than the data lasers.

In yet another embodiment of the present invention, a transistor base leakage is used to emulate a large resistance element to result in a long time constant without the use of a large capacitor or large resistance.

In yet another embodiment of the present invention, a split power supply is provided to provide a lower supply voltage to a portion of a circuit, thus reducing power consumption of the overall circuit.

In yet another embodiment of the present invention, a low off-voltage is selected for a laser driver for driving longwave VCSELS.

In yet another embodiment of the present invention, feedback is used to reduce baseline wander and Inter Symbol Interference (ISI) that are produced by a low frequency dip appearing in the frequency response observed when using a PNP current source in conjunction with an NPN differential stage to drive a laser. A feedback resistor is employed in the PNP current mirror to substantially flatten the dip present in the frequency response.

BRIEF DESCRIPTION OF THE DRAWINGS

The present invention will be better understood from the following detailed description, when read in conjunction with the accompanying drawings. It is emphasized that, according to common practice, the various features of the drawings are not to-scale. On the contrary, the dimensions of the various features are arbitrarily expanded or reduced for clarity. Included in the drawings are the following figures:

FIGS. 13A and 13B are schematic diagrams illustrating the use of feedback in a PNP current mirror source to reduce baseline wander and ISI according to one embodiment of the present invention.

DETAILED DESCRIPTION OF EMBODIMENTS OF THE INVENTION

I. Overview

One embodiment of the present invention provides an apparatus and method to control both the average power and optical modulation amplitude (OMA) of laser signals driven by an array of laser drivers. The apparatus and method may be used to drive a single laser using a single laser driver or an array of lasers. The laser drivers in such a driver array may be integrated on a single integrated circuit. Other embodiments of the present invention are directed to providing power savings to the laser driver (or the laser driver array in case of driving multiple lasers) and to maintaining desired parameters of the optical output signals. Embodiments of the present invention may be particularly useful in high-speed applications, such as, for example, ones having 2.5 GBPS (Giga Bits Per Second) data rates. Embodiments of the present invention may also support systems having lower or higher data rates than 2.5 GBPS. In an exemplary embodiment, the lasers may be shortwave or longwave VCSELs but it should be understood that embodiments of the present invention also apply to other lasers, such as, for example, edge emitting lasers.

Figure 1:
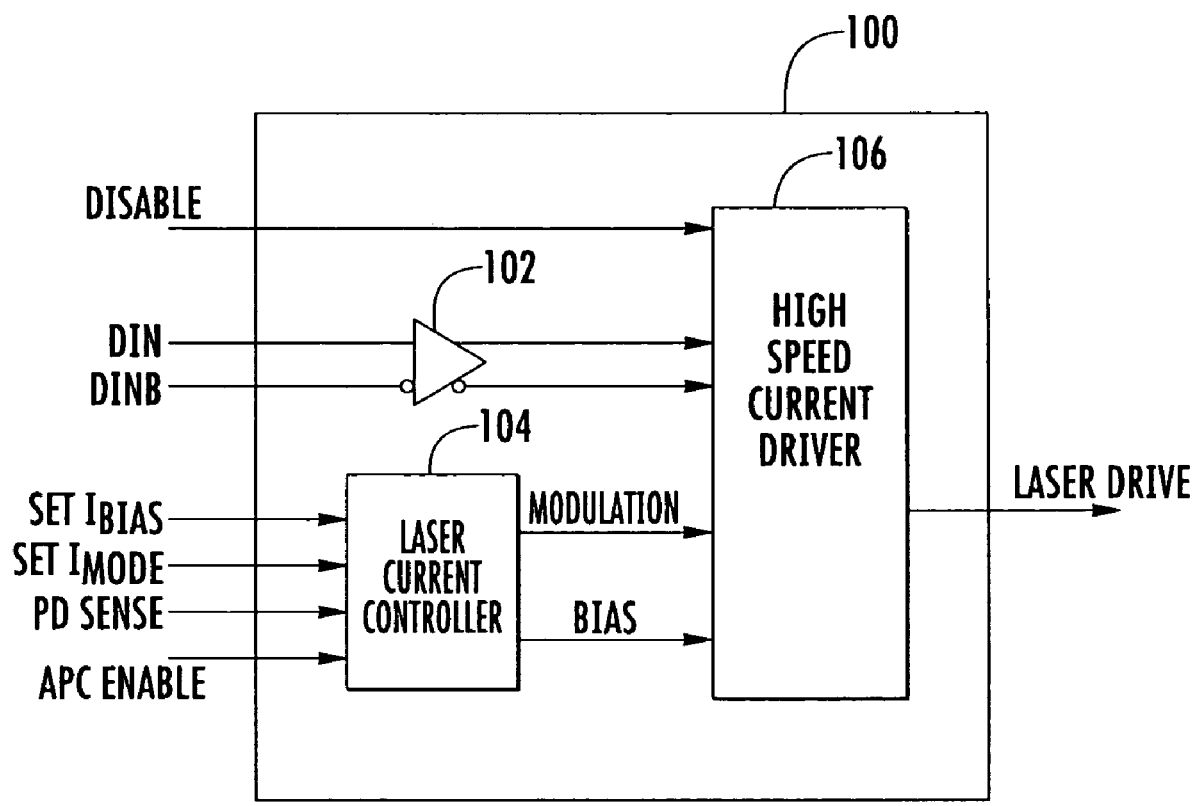
FIG. 1 is a generalized schematic laser driver array block diagram.

FIG. 1 is a block diagram of a laser driver 100, which may include one or more embodiments of the present invention. The laser driver 100 may be implemented on a single integrated circuit chip, but may also be implemented in two or more separate integrated circuit chips. The laser driver 100 typically has an operating temperature range of 0-85 C, but it may operate at other temperatures as well. The laser driver 100 may include one or more of the following features which are described in detail below: 1) Laser Power Down Feature; 2) Dual Feedback Laser Driver Implementation for Use with Low Bandwidth Photodetectors, using either a control laser or a data laser for feedback; 3) Slow Discharge Implementation by Use of Transistor Base Leakage; 4) Laser Driver Split Power Supply 2.5/3.3 Volt Feature; 5) Low Off-Voltage Laser Driver for Longwave VCSELs; and 6) Feedback to Reduce Baseline Wander and Inter Symbol Interference (ISI) for Low Bandwidth PNP source.

As shown, the laser driver 100 includes a differential data driver 102, a laser current controller 104 and a high-speed current driver 106. It should be understood, however, that the laser driver 100 as illustrated is exemplary only, and the laser driver 100 may include one or more other components to perform laser driving functions in conjunction with the components illustrated in FIG. 1. For example, the laser driver 100 may be used to drive a single laser or multiple lasers, which may be organized into a laser array. When the laser driver 100 is used to drive multiple lasers, for example, the laser driver 100 may include multiple high-speed current drivers, one for each of the multiple lasers. However, even when multiple high-speed current drivers are used, only one laser current controller need be used to provide modulation and bias currents to the multiple high-speed current drivers. By avoiding duplication of the circuitry for overhead functions that may be implemented in a single circuit, e.g., the laser current controller, additional power savings may be realized.

To provide the modulation and bias currents to the high-speed current driver 106, the laser current controller 104 receives a set bias current (Set $I_{bias}$) signal and a set modulation current (Set $I_{mod}$) signal. The laser driver 100 may work in an open loop mode where the set bias current signal and the set modulation current signal are used to set bias and modulation currents, respectively. The set bias current signal may be used to set the bias current, for example, to 4 mA or 6 mA. The set modulation current signal may be used to set the modulation current.

In one embodiment of the present invention, the laser driver array may also work in a feedback loop mode, which may also be referred to as an automatic power control (APC) mode, to adjust the modulation and bias currents. Upon assertion of an APC enable signal received by the laser current controller 104, the laser driver 100 may operate in the feedback mode in which the modulation and bias currents are adjusted based on one or more feedback signals (not shown).

The high-speed current driver 106 receives differential data signals, DIN and DINB from the differential data driver 102, and converts them into an appropriate current signal, using the bias and modulation currents, to drive the corresponding laser. A single-ended driver may be used instead of the differential driver in some embodiments. When multiple high-speed current drivers are used to drive multiple lasers, multiple differential data drivers provide differential data signals to the multiple high-speed current drivers.

The laser driver 100 may further includes a disable feature using a disable signal to disable the laser when the laser is not used, further reducing power consumption. The disable signal may be provided to the high-speed current driver 106. When the laser driver includes a laser driver array implemented on a single integrated circuit chip to drive multiple lasers, the disable feature allows the laser driver to selectively drive lasers, in an array of lasers, separately. If the integrated circuit is designed to drive 12 VCSELs, for example, a quad disable signal may be used to turn off four of the laser drivers, allowing the integrated circuit to drive an array of 8 VCSELs. The capability to turn off one or more laser drivers may be referred to as an IC laser power down feature, or as a laser power down feature.

II. Laser Power Down Feature

Figure 2:
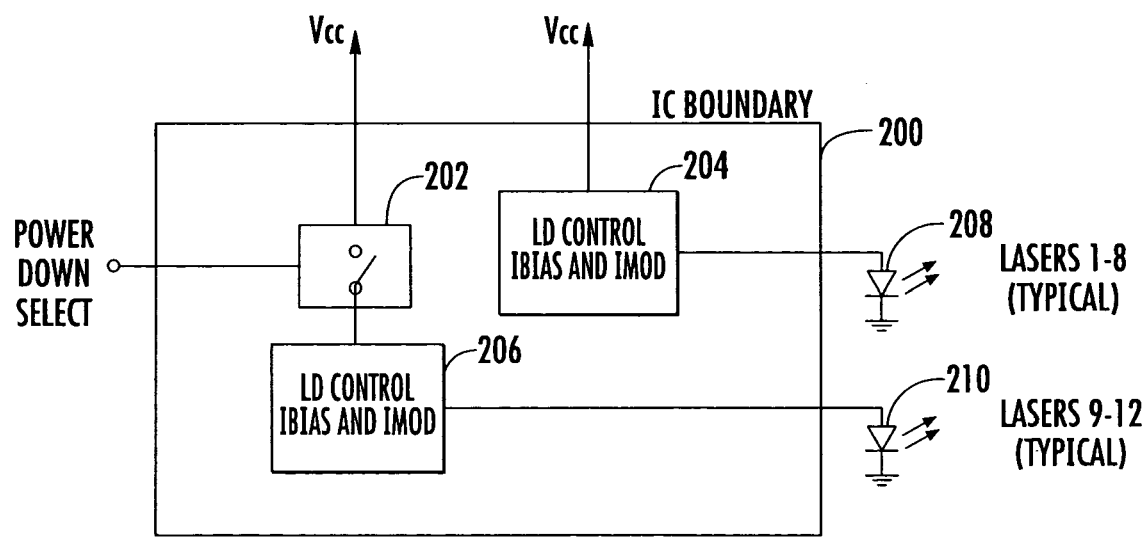
FIG. 2 is a generalized schematic block diagram showing an integrated circuit with laser power down feature.

One embodiment the present invention includes a laser driver array for driving a laser array in the present includes a power down feature as illustrated in FIG. 2. The power down feature is typically implemented in an integrated circuit that includes a laser driver array. The laser driver array 200 includes a first laser driver control circuit 204 and a second laser driver control circuit 206. The laser driver array 200 also includes a power down select switch 202. The first laser driver control circuit drives, by providing $I_{bias}$ and $I_{mod}$ currents, lasers 1-8 represented by a laser 208. Similarly the second laser driver control circuit drives, by providing $I_{bias}$ and $I_{mod}$ currents, lasers 9-12 represented by a laser 210.

The first laser driver control circuit 204 is coupled directly to a power supply voltage Vcc. However, the second laser driver control circuit 206 is coupled to the power supply voltage Vcc via a power down select switch 202. A power down select signal is provided to the power down select switch to open and close the switch 202. When the switch is closed, the power supply voltage Vcc is provided to the second laser driver control circuit, allowing it to drive four lasers, lasers 9-12, in addition to the lasers 1-8. When the switch is open, however, the second laser driver control circuit is not powered. With this option for controlling power to one or more laser drivers, power may be saved while less than all the laser drivers in the laser driver array are needed to meet laser driving needs for low power dissipation applications. At the same time, availability of the additional laser driving capability allows for a flexible design so that a single IC design may be used for multiple applications.

In the laser driver array 200, there are total of twelve laser drivers, four of which may be turned off and on with the power down select switch. In other embodiments, there may be more or less than twelve laser drivers in the laser driver array. In addition, the number of lasers that may be switched off and on may be different. For example, the laser driver array may include eight, twelve or any other suitable number of laser drivers. Further, other embodiments may include more than one power down select switch to switch more than one group of laser drivers on and off.

The laser power down feature may be applied to various different types of laser drivers including but not limited to longwave VCL (vertical cavity laser) array drivers, shortwave VCL array drivers and edge emitting laser array drivers. In many system applications, use of a single part rather than multiple different parts having different number of laser drivers in the laser driver array may result in cost reduction and reduction of manufacturing process needs due to production of greater volume for a single part.

III. Dual Feedback Laser Driver Implementation for Use with Low Bandwidth Photodetectors Bias and modulation currents $I_{bias}$ and $I_{mod}$ are typically fed to a single laser driver to drive a single laser or to multiple laser drivers to drive multiple lasers. The bias current $I_{bias}$ given a constant modulation current, will affect the average power, $P_{ave}$, of the optical signal emitted by the laser. The modulation current $I_{mod}$ typically modulates the optical power signal above and below the average power level to provide peak-to-peak amplitude. It is often desirable to maintain an average power $P_{ave}$ as well as optical modulation amplitude (OMA), typically defined as $P_{high}-P_{low}$, or extinction ratio (ER) of the laser, typically defined as $P_{high}/P_{low}$, within predetermined limit values in order to insure proper operating parameters. It should be understood that when OMA falls within the predefined range, in accordance with relevant specifications, for example, ER commonly also falls within an acceptable range, since the OMA and ER are related to one another.

As the operating temperature of the laser increases, the slope efficiency, typically defined as the laser current-to-optical power ratio, commonly decreases. As the temperature of the environment including the laser increases, the bias current needed to produce a given average optical power typically also changes. Specifically, the slope of the laser current-to-optical power ratio decreases, and more current is typically used to produce a given change in optical power. Furthermore, the change in slope as a function of temperature varies from laser to laser, and the slope for a given laser varies with the age of the laser.

Figure 3:
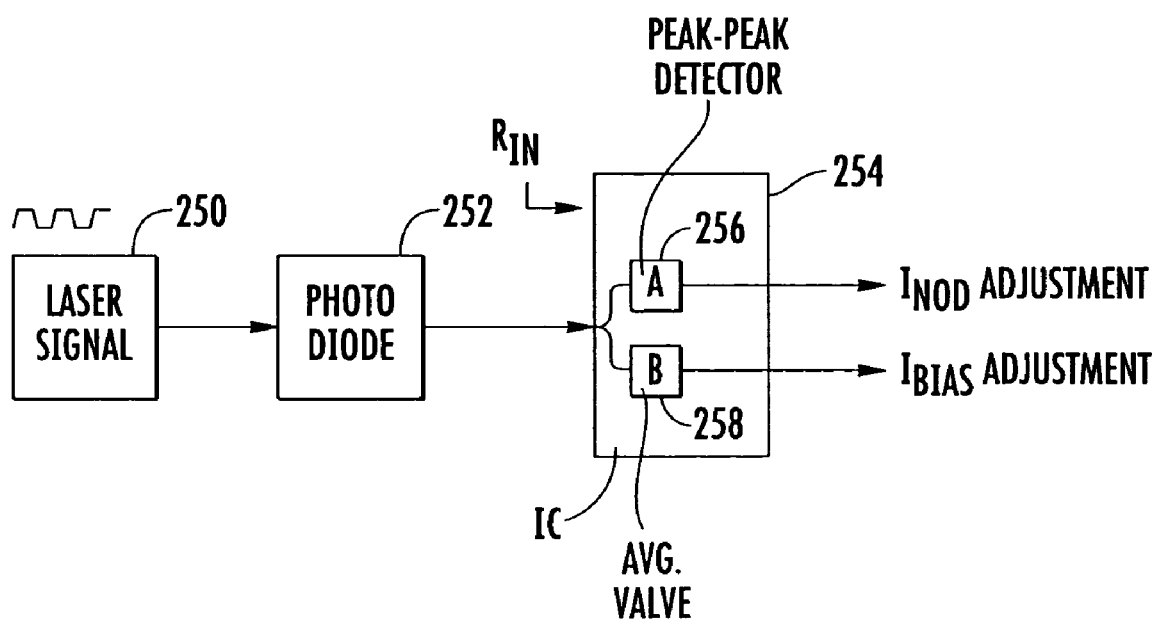
FIG. 3 is a generalized schematic block diagram showing $I_{mod}$ and $I_{bias}$ adjustment currents generated using a photodiode, peak detector and a average power circuit.

In one embodiment of the present invention, $I_{bias}$ and $I_{mod}$ currents are adjusted using dual feedback loops, one for each of the $I_{bias}$ and $I_{mod}$ currents, to maintain laser power within predetermined limit values to compensate for changes to laser characteristics due to such factors as the operating temperature and the age of the laser. FIG. 3 is a generalized schematic block diagram showing a laser signal 250 sensed by a photodetector 252 which may be a photodiode. The terms photodiode and photodetector may generally be used interchangeably. FIG. 3 illustrates the general principle used for adjustment of the $I_{bias}$ and $I_{mod}$ currents using the feedback loops.

The signal from the photodetector is fed to a circuit 254, which includes a peak-to-peak detector 256, and an average power detector 258. The peak-to-peak detector and the average power detector are used in their respective feedback loop to adjust the modulation current $I_{mod}$ and the bias current $I_{bias}$, respectively. In this scheme, the laser signal 250 is the output of the laser that is being adjusted by the adjustments to the $I_{bias}$ and $I_{mod}$ currents. Therefore, the laser signal in this circuit is fed back into the circuit to make the laser output power adjustment. In embodiments of the present invention, use of the dual feedback loops to adjust the laser output power may also be referred to as an Automatic Power Control (APC) and Automatic Modulation Control (AMC).

Figure 4:
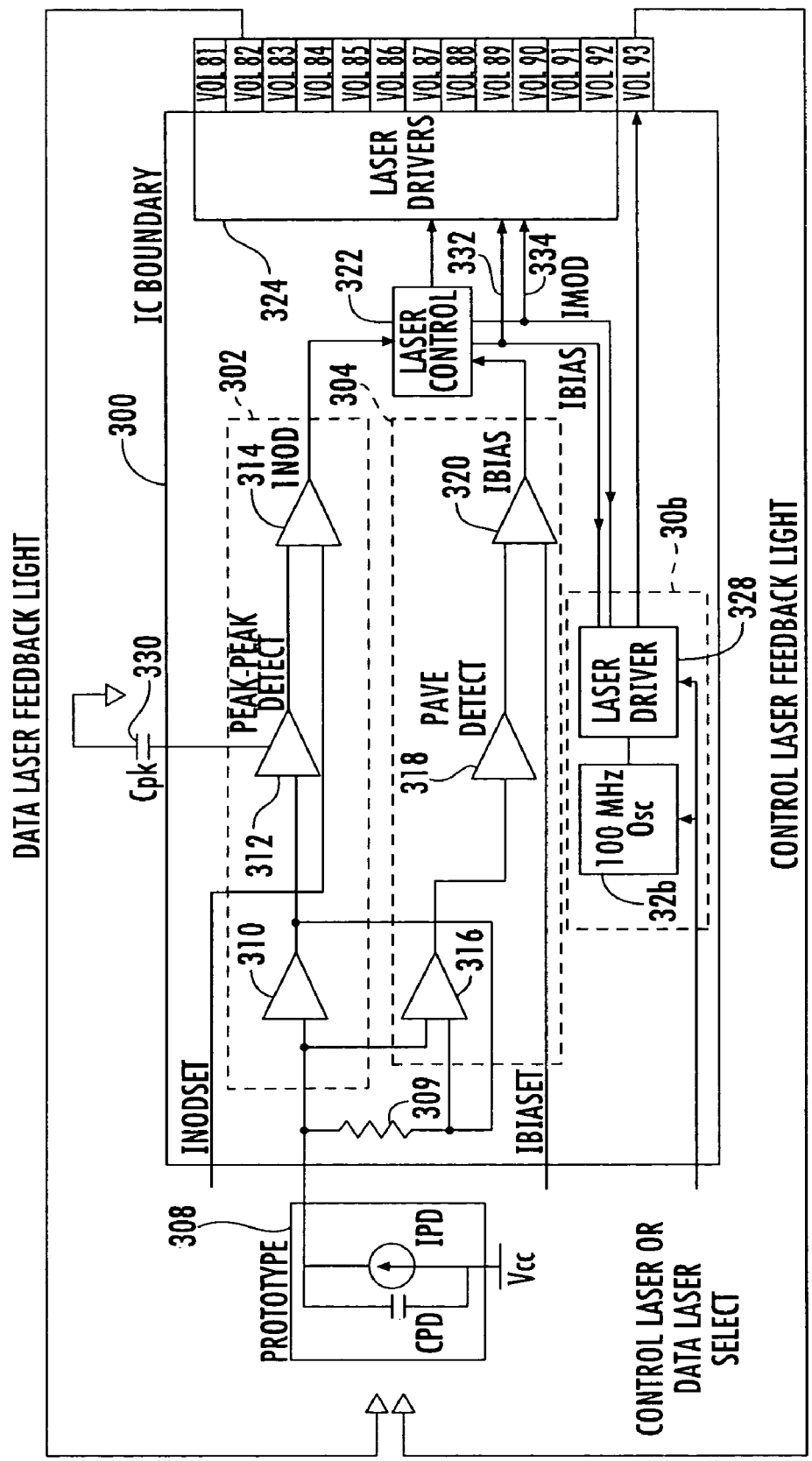
FIG. 4 is a combination circuit and block diagram showing the dual feedback loop in an embodiment of the present invention.

FIG. 4 is a circuit/block diagram showing a dual feedback loop in one embodiment of the present invention. In the embodiment shown in FIG. 4, a laser driver array 300 is implemented on a single integrated circuit (IC). In other embodiments, more than one integrated circuit may be used to implement the laser driver array. In still other embodiments, the dual feedback loop may be used with only a single laser driver for driving a single laser.

The laser driver array 300 includes laser drivers 324. The laser drivers 324 include twelve laser drivers for VCSEL 01 through VCSEL 12. The twelve laser drivers in the laser driver array 324 may be referred to as data laser drivers for VCSEL 01 through VCSEL 12. The laser driver array also includes a 13$^{th}$ laser driver 328, which is used as a control laser driver for VCSEL 13. VCSEL 13 is referred to as a control VCSEL or as an extra VCSEL.

In the laser drivers 324 of FIG. 4, the 13$^{th}$ laser driver 328 is a control laser driver, however, in practice, any one of the twelve laser drivers in the laser drivers 324 may be used as a control laser driver. The lasers, which may be driven, are not limited to VCSELs, and in other embodiments, other lasers such as edge emitting lasers may be used. In still other embodiments, some or all of the laser drivers may be external to the integrated circuit. Furthermore, the thirteen VCSELs illustrated are intended to be exemplary only and other numbers of data and total VCSELs may be included in alternative embodiments. In some embodiments data lasers may be used to provide feedback, thus eliminating the need for a control laser and a control laser driver.

The laser driver array 300 provides for Automatic Power Control (APC) feedback or open loop operation and the ability to switch between the two modes. The second feedback mechanism is an automatic modulation control (AMC). The dual feedback control system is used to provide an adjustment to both the bias current and the modulation current fed to the laser drivers. The laser driver array 300 includes a bias feedback loop for adjusting the bias current based on average optical power detection. The bias feedback loop includes a bias feedback path 304. The laser driver array 300 also includes a modulation feedback loop for adjusting the modulation current based on peak-to-peak detection. The modulation feedback loop includes a modulation feedback path 302. A signal accumulation capacitor $C_{pk}$ may be used to set the discharge time constant for the peak-to-peak detector. The signal accumulation capacitor $C_{pk}$ may be integrated with the integrated circuit 300, or it may be implemented as an external capacitor.

Light emitted from either the control laser or one of the data lasers is monitored using the photodetector 308 and a transimpedence amplifier (TIA) 310. The TIA 310 is used in the modulation current feedback path to adjust the modulation current $I_{mod}$, while the amplifier 316 is used in the bias feedback path to adjust the bias current $I_{bias}$. According to one exemplary embodiment, the laser driver for each of the lasers within the array is included within an integrated circuit. According to another exemplary embodiment, the laser drivers may be external to the integrated circuit.

The bias and modulation currents, $I_{bias}$ and $I_{mod}$, respectively, are used to set the lasers at room temperature and are programmed from a temperature stabilized voltage reference. The $I_{bias}$ and $I_{mod}$ currents may be adjusted through the selection of one set resistor for all lasers in the array. From the laser control, an adjusted bias current 332 and an adjusted modulation current 334 are generated, and each is fed to each laser driver of the array of laser drivers 324 as well as the control laser driver 328. The photodetector 308 may be disposed in proximity to one of the data lasers VCSEL 01 through VCSEL 12 or the control laser (VCSEL 13) depending on the exemplary embodiment used. More particularly, the photodetector 308 may be configured to absorb light emitted from the VCSEL that is situated proximately to the photodetector. FIG. 4 shows that the singular detected bias and modulation currents are used to adjust the $I_{bias}$ and $I_{mod}$ signals 332 and 334 respectively, provided to each of the VCSELs 01-13.

The laser driver array 300 of FIG. 4 is illustrated as receiving two feedback lights, a data laser feedback light and a control laser feedback light. Generally, only one of the feedback lights may be implemented and used. For example, one embodiment may use only the control laser feedback while another embodiment may use only the data laser feedback.

A. Use of Control Laser Feedback Loop

Conventional photodetectors used in feedback systems for optical communication systems typically have capacitance that tends to slow down data detection, so that $P_{high}$ and $P_{low}$ may not be detected properly on a real-time basis for high-speed optical communication systems. Thus, laser drivers that use feedback for adjusting output optical modulation amplitude generally use high-speed photodetectors which are typically difficult to assemble and costly to manufacture. If a laser that is driven at a slower speed may be used to provide feedback signal, slower photodetectors may be used. The slower speed photodetectors are typically easier to assembly and less costly to manufacture.

In this embodiment of the present invention, an extra laser is used as a control laser to provide average optical power and peak-to-peak information and to provide for the adjustment of the modulation current and the bias current delivered to each of the data laser drivers of the laser driver array 324 to control the average optical power and optical modulation amplitude (OMA).

As illustrated in FIG. 4, a control laser driver circuit 306 is used to drive the control laser, VCSEL 13. The VCSEL 13 may have substantially the same operating characteristics as those of the other VCSELs of the array, such as VCSELs formed on the same substrate. The control laser driver circuit 306 includes a 100 MHz oscillator 326 and the laser driver 328. The 100 MHz oscillator may provide the modulation to the laser driver 328 to drive the control laser. In other embodiments, the oscillation frequency of the oscillator may be more or less than 100 MHz. Since the oscillation frequency of 100 MHz is generally much lower than the data rate commonly used in optical communication systems, such as, for example, 2.5 GBPS (Gigabits per second). Since the control laser operates at a lower frequency photodetectors having lower frequency responses may be used.

Figure 5:
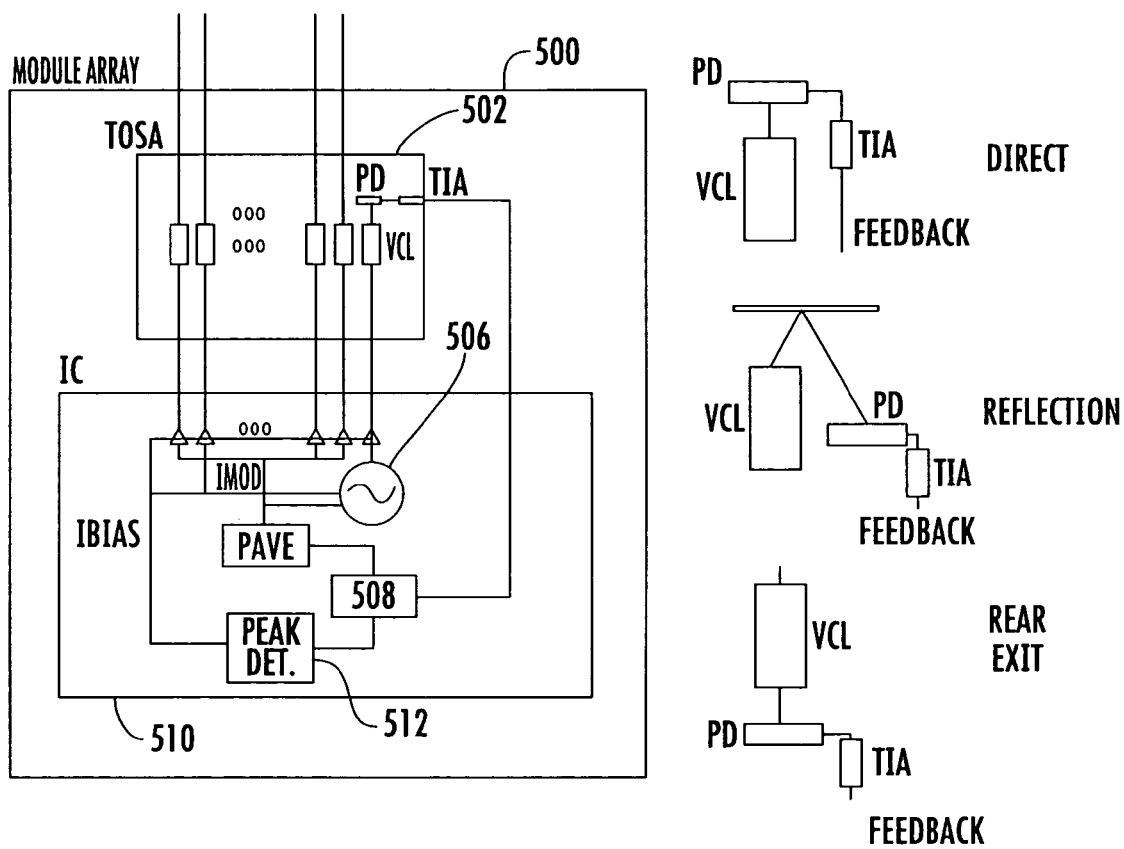
FIG. 5 is a block diagram illustrating another laser feedback loop embodiment of the present invention.

FIG. 5 is a block diagram 500 illustrating an arrangement of data lasers and a control laser in an exemplary laser array 502. In other embodiments, the control laser may be used with varying numbers of data lasers, including a single laser. The control laser in FIG. 5 is illustrated as the 13$^{th}$ laser, however the distinction is arbitrary and any laser may be used as the control laser. The same $I_{bias}$ and $I_{mod}$ currents, used to drive the data lasers within the array, also drive the control laser.

Depending on the laser used, any of a direct, reflection, or rear exit feedback configuration may be used for the photodetector and TIA arrangement to provide feedback as to the laser output power. For the case of the rear exit feedback configuration, the optical power feedback is commonly proportional to the light from the primary emission. For example, when edge emitting lasers or long wavelength VCSELs emitting at 1.3 microns are used, the rear exit configuration may be used since light is transmitted out of each of the opposing ends of the laser. The other feedback configurations illustrated may be used as well. For another example, for a non-long wavelength VCSEL, a direct or reflection configuration may be used depending on the environment within which the control laser is formed.

As shown in each of FIGS. 4 and 5, an oscillator (100 MHz oscillator 326 or the oscillator 506) is used to provide a signal to the control laser. The signal has a significantly lower frequency than the data signal delivered to the data lasers. For example, in a 2.5 GBPS system, the signal provided to the control laser may be on the order of 50 MHz-150 MHz. This signal may include substantially the same amplitude and power but is transmitted at a lower speed.

According to this exemplary embodiment, the capacitance of the photodetector, which is typically a limiting factor in high-speed applications because it does not allow the photodetector to charge and discharge quickly enough for the peak-to-peak amplitude to be detected. By using a lower frequency signal, such as the 50 MHz-150 MHz signal of the present embodiment a lower frequency response photodetector may be used. It is typically advantageous to use the lower frequency photodetector because they are generally easier to build than high-speed photodetectors, which commonly must be built smaller to limit their capacitance. Further, for the high-speed photodetector to operate successfully, the TIA typically may need to be placed in proximity to the photodetector itself, and not integrated into the IC.

Since the control laser operates at a significantly lower frequency, the average optical power and the peak-to-peak optical power may be determined for the control laser on a real time basis, instead of having to wait for a suitable data pattern so that these parameters may be detected. The average optical power and the peak-to-peak optical power may then be provided in a timely fashion to the feedback loops which adjust the modulation and bias currents.

The control laser is useful in high-speed application such as Gigabit Ethernet applications or other applications where repeated bit streams are limited in number such that low speed photodetectors are not practical to detect average and peak to peak values for feedback purposes. The capability to use slower photodetector diodes may result in simplified assembly and manufacture, which in turn may lead to reduction in cost. The lower frequency parameter detection also requires reduced high-speed considerations such as impedance matching, transmission lines, and issues associated with parasitic capacitance, inductance, etc. Further, the capability to operate at low frequency may simplify the use of the TIA, allowing it to be located further away from its photodiode and placed in an IC with less power dissipation than would otherwise have been required.

The laser driver array may support various different signaling formats including but not limited to SONET (Synchronous Optical NETwork) that uses pseudo random signal formats as well as Gigabit Ethernet and other applications that do not use pseudo random signal formats. The embodiment using the control laser supports applications that do not use pseudo random signal formats as well as those that do. However, for applications that use pseudo random signal formats, a data laser may be used instead of the control laser to provide feedback signals to adjust $I_{mod}$ and $I_{bias}$. Use of the data laser instead of the control laser eliminates the need to supply power to the control laser, and thus results in reduced overall power requirements.

B. Use of Data Laser for Feedback

One of the data lasers may be used to provide feedback in one embodiment of the present invention when the application is for a system with pseudo random signal formats, such as, for example, SONET, a commonly used network used in optical communication equipment. In this embodiment, the control laser may be disabled to reduce power dissipation by using a control laser select signal provided to the control laser driver circuit 306. This embodiment may be used with other data formats other than SONET. It may work with any system for dealing with pseudo random data, anything that allows for a long string of 1's sufficient to allow a photodetector used with the system to reach substantially a peak value of the signal. The data is not required to be pseudo random if a sufficient number of successive 1's are periodically present. If a sufficient number of successive 1's are periodically present a photodetector may reach substantially the peak value (and a sufficient number of successive 0's are present to allow the photodectector to discharge to the level corresponding to a logical zero light intensity). Statistically a sufficient number of repeated bits are necessary to allow the photodector to charge or discharge to levels representative of limit values. The present embodiment, however, will be described in detail primarily in reference to a SONET system for illustrative purposes.

SONET specifications are commonly prescribed and used in optical communication systems. A SONET data signal is a pseudo random signal which provides a high statistical probability that a sufficient number of consecutive bits will be present and therefore may be received and accumulated within a parasitic capacitance of the photodetector to allow the photodetector to charge to a maximum (and discharge to a minimum) value even for very high-speed applications. A bit may be a "1" or a "0". Although the following discussion will refer to bits as "1's" and will discuss the accumulated charge associated with having a sufficient number of repeating "1s" (high power level) in a data sequence, it should be understood that the same applies to repeating "0s" (low power level) in a data sequence. In other words though a sequence of "1s" will be used to illustrate the photodetector charging to a maximum value, a sequence of "0s" is equivalently necessary to discharge the photo detector to a minimum value.

Figure 6:
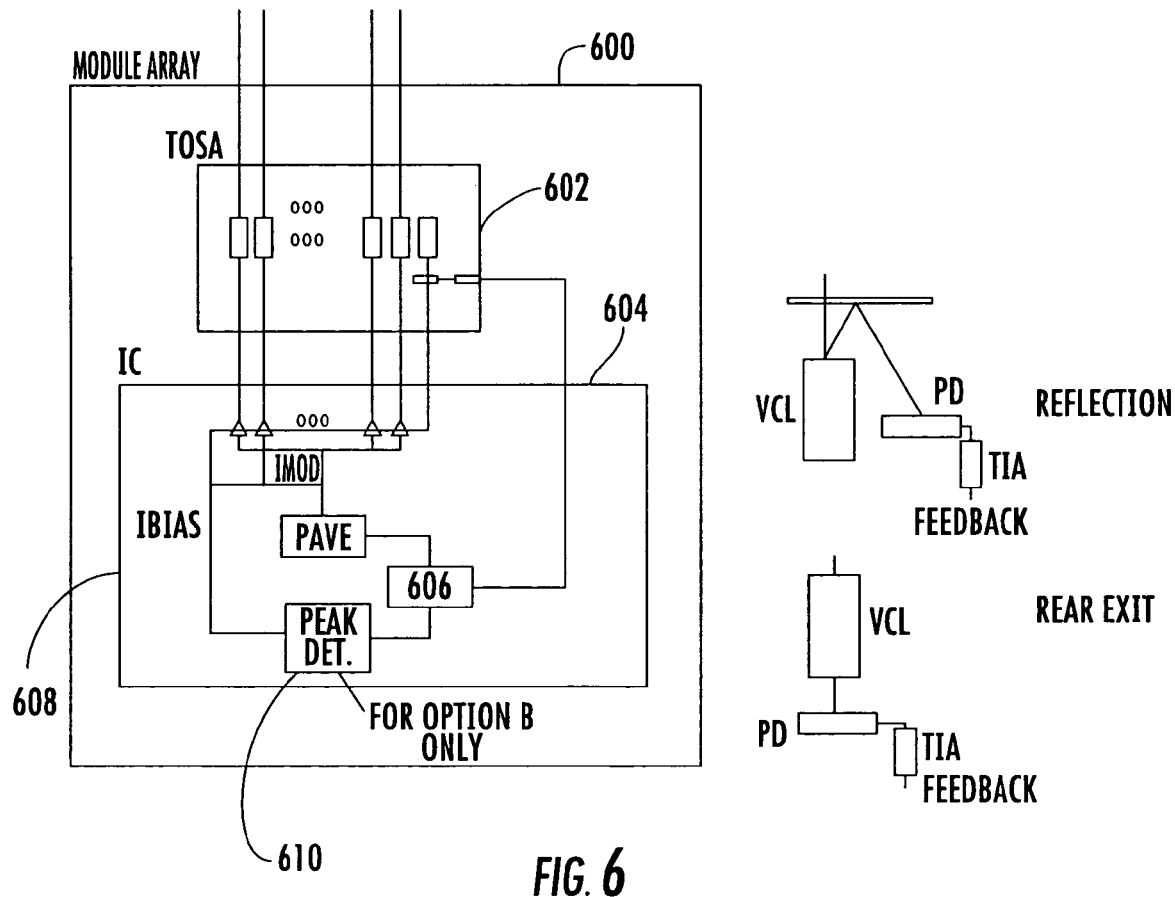
FIG. 6 is a block diagram illustrating yet another laser feedback loop according to an embodiment of the present invention.

FIG. 6 shows an exemplary arrangement for the embodiment in which one of the data lasers is used to provide the feedback signal. It can be seen that the photodetector (PD) arrangement may be a reflection arrangement or a rear exit arrangement, which have been discussed above in reference to FIG. 5. The use of the data laser to provide feedback typically does not provide for direct monitoring of the optical signal from the data laser because the optical signal is transmitted to an optical medium and any direct monitoring would necessarily attenuate or otherwise compromise the transmitted signal. Therefore, one of reflection and rear exit arrangements commonly are used. The TIA used may be a low power TIA.

Figure 7A:
FIGS. 7A, 7B and 7C are graphical diagrams illustrating the effect of photodiode capacitance on a received optical signal.
Figure 7B:
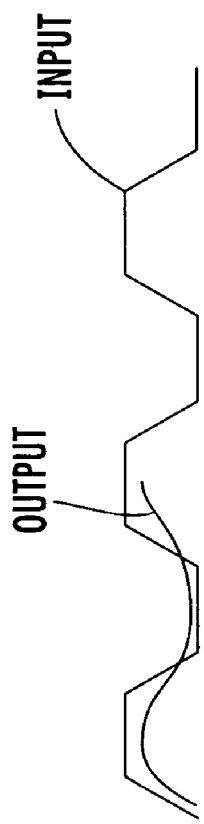
Figure 7C:
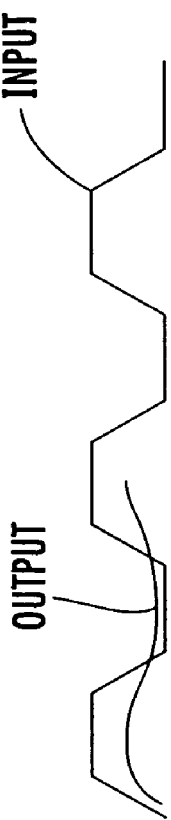

FIGS. 7A-C illustrate the effect that the photodetector capacitance may have upon a propagated optical signal. FIG. 7A shows a general case in which a photodetector is modeled as a low pass filter (LPF) receiving a waveform representing a laser signal. It can be seen that the rise and fall times of the peak-to-peak signal have been increased, as the high frequency components of the signal are attenuated. FIG. 7B shows the effect of low capacitance, high bandwidth photodetectors and shows that the peak-to-peak amplitude is approximated, even though the limited bandwidth still results in somewhat slower rise and fall times than the original signal. Such high frequency response photodetectors are difficult and expensive to make and are not therefore commercially practical. FIG. 7C shows the effect on a laser signal of a low bandwidth, high capacitance photodetector. It can be seen that the peak-to-peak information regarding the signal is generally lost, as the photodetector does not have the high frequency response necessary to produce a good approximation of the original signal.

Figure 8:
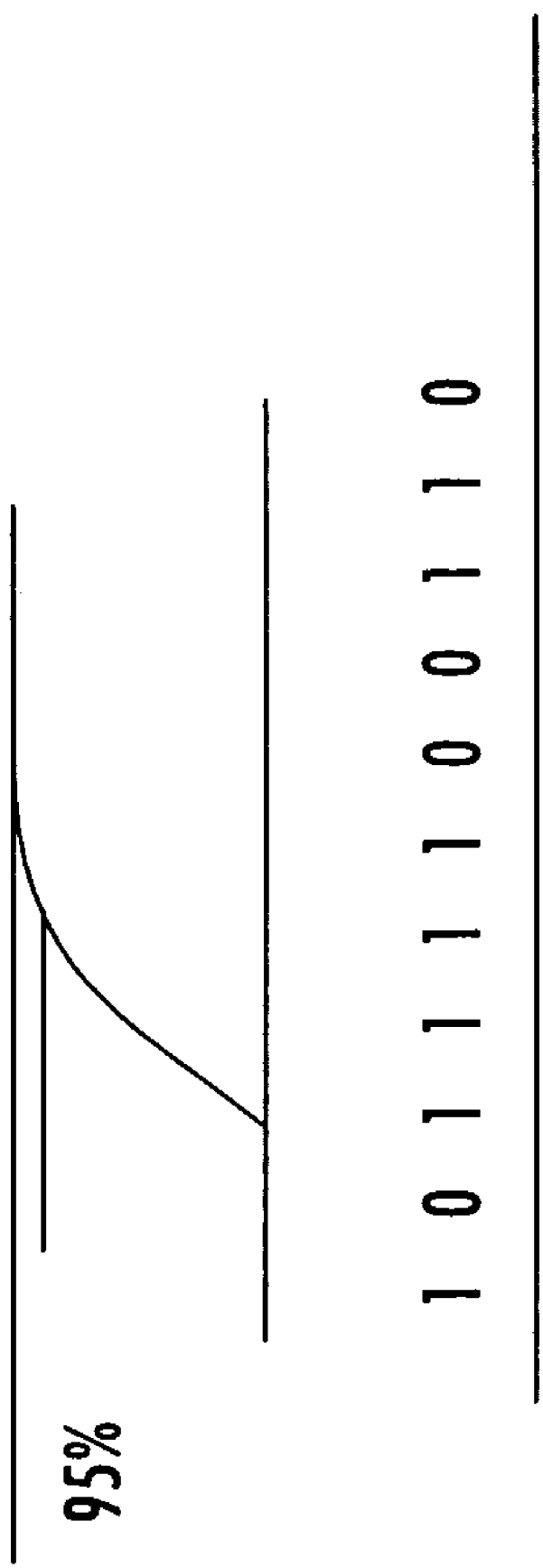
FIG. 8 is a graphical illustration of the accumulation of charge in an optical detector with respect to the data pattern received.

In SONET and other pseudo random signal generation applications, it is assumed that the pseudo random data signal provides a statistical probability that a sufficient number of repeating "1's" in a data sequence will be provided to allow a capacitance of a photodetector to charge sufficiently to approximate the peak value of the signal. An example of a sufficient number of consecutive "1s" being received to allow a photodetector to charge to essentially a maximum value is shown in FIG. 8. If a sufficient number of consecutive 1's are received to charge a capacitor to approximately the peak value, a representation of that peak can be obtained using a photodetector operating at a lower speed than the transmit data rate.

The data sequence shown in FIG. 8 is intended to be exemplary only, and various other data sequences can be obtained in SONET and other pseudo random signal generation applications. It should be understood that SONET and other pseudo random signal generation applications may insure statistically that a sufficient number of "1's" in a data sequence will be provided to accumulate and provide an approximation of the peak amplitude. Accordingly an integrated circuit may be designed to provide for fast charging and slow discharging to assure that the statistical probability of repeating "1's" will allow sufficient charge accumulation to produce a signal of approximately the maximum amplitude, thus assuring accurate peak value detection.

For example, in order for an approximation of a full amplitude signal to be detected, the time constant for the discharge time should be controlled. Configuring the discharge time at a sufficiently large value by providing a high resistance and/or high capacitance, in the discharge circuitry, increases the discharge time constant of the circuit. A peak-to-peak detection circuit with a long discharge is illustrated at 312 in the laser driver array 300 of FIG. 4. In one embodiment, the capacitance of the signal accumulation capacitor $C_{pk}$ 330 in FIG. 4 may be maintained at a sufficiently high value. As discussed above however a high capacitance will limit the high frequency response and so it is preferable to produce a long time constant by increasing resistance rather than capacitance. Additionally higher capacitance tends to require increased integrated circuit real estate.

Thus, one of the data lasers operating at high-speed, e.g., 2.5 GBPS, may be used for feedback when single or array lasers, including but not limited to shortwave and longwave VCSELs for SONET or other signal formats using pseudo random data transfer, or signal formats with sufficient number of repeating data bits, are used. The capability to use slower photodetector diodes may result in simplified assembly and manufacture, which in turn may lead to reduction in cost. The operations at lower frequency also typically reduces the need to resolve issues related to impedance matching, transmission lines, and issues associated with parasitic capacitance, inductance, and the like.

Further, the capability to operate at low frequency may allow for the use of simplified TIA located further away from photodiode. Such a TIA may be placed in IC and dissipate less power than otherwise would be required. In addition, through the use of the slow discharge implementation, SONET or other applications using pseudo random signal formats may be supported without the added power dissipation required by an additional control laser.

IV. Slow Discharge Implementation by Use of Transistor Base Leakage

The slow discharging may also be realized through use of high resistance in the peak-to-peak detector. Returning now to FIG. 4, when a resistor is used in the peak-to-peak detector 312 to form a RC-circuit with the $C_{pk}$ 330, longer discharge times may be realized by using higher value resistors. Therefore, increasing the resistance of the resistor coupled to the signal accumulation capacitor Cpk may also increase the discharge time. However, it is often undesirable or impractical to implement a high value resistor in an integrated circuit due to space and other limitations. Additionally high resistances may be difficult to control accurately in fabrication.

Figure 9:
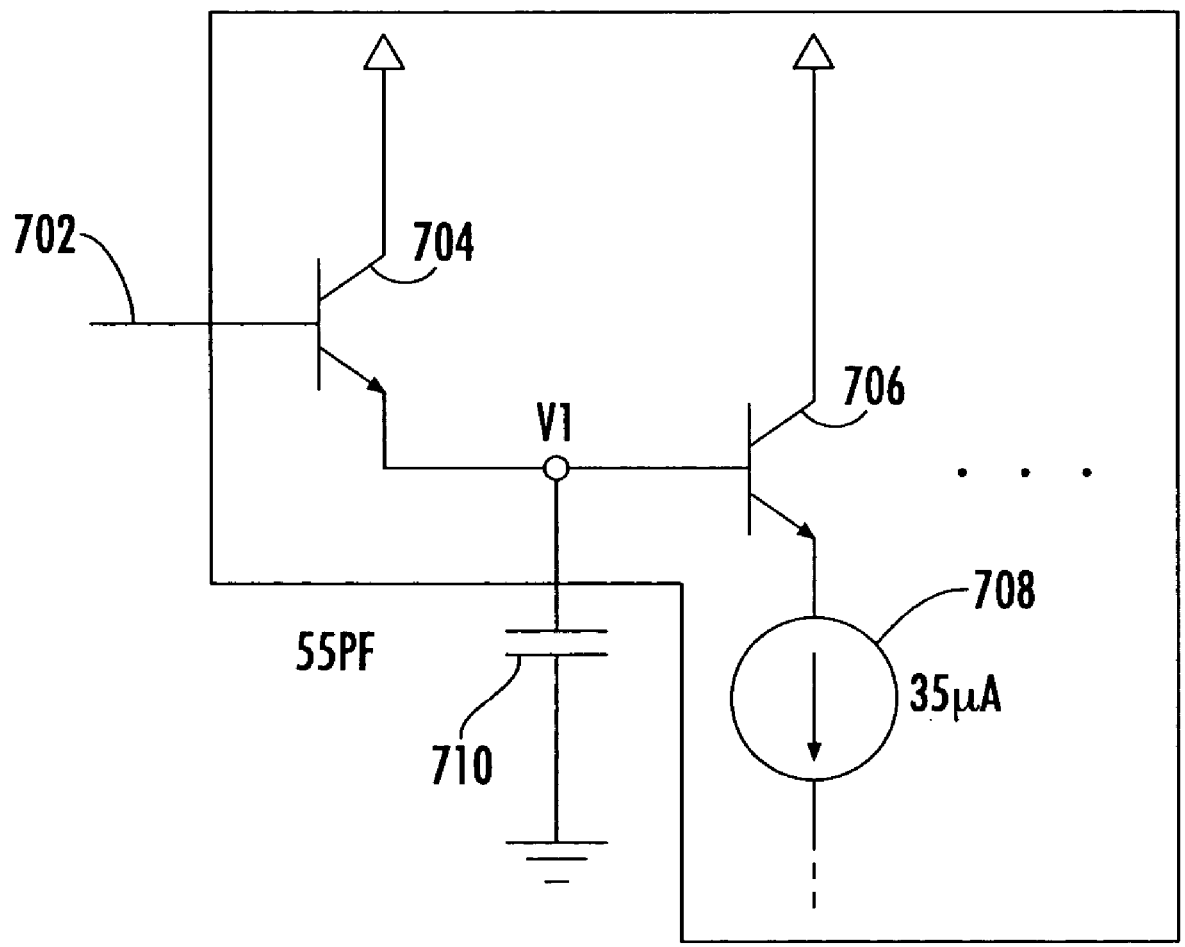
FIG. 9 is a generalized schematic block diagram of input circuitry of a peak-to-peak detector, which includes transistors configured to result in a sufficiently long discharge time.

Therefore, in one embodiment of the present invention, the high resistance of the resistor is simulated by using transistor base current, which may be provided in accordance with the circuitry of a peak-to-peak detector 700 shown in FIG. 9. Of course, a peak-to-peak detector may include other components, and the input circuitry shown in FIG. 9 is for illustrative purposes only. The peak-to-peak detector 700 includes an input 702 via which the peak-to-peak detector receives an output of the feedback photodetector via a TIA. The input 702 is provided to a base of an illustrative NPN input transistor 704. An emitter of the input transistor provides output voltage V1 at a base of a discharge time control transistor 706. The output voltage V1 depends on the photodetector voltage, which is provided as an input 702 via a TIA.

An emitter of the input transistor 704 provides the current to charge the capacitor 710. The base of the discharge time control transistor 706 provides the discharge path for capacitor $C_{pk}$ 710. The input transistor 704 serves as a rectifier/diode of the electrical signal received from the photodetector. Since transistor 706 is limited to an emitter current of (illustratively) 35 μamps the base leakage current of transistor 706 is limited to a value equal to the emitter current divided by β, the current amplification of transistor 706. Accordingly the base current of transistor 706 is limited to 35 μAmps/β, that is a small value that generally results in a relatively long discharge time, thus providing a similar effect as adding a large resistor.

The signal accumulation capacitor $C_{pk}$ 710 controls discharge time according to the equation $I=C_{pk}dv/dt$. $C_{pk}$ may be on the order of 5.5 pf but other capacitance values may be used alternatively. The current source 708 that provides the discharge current may supply 35 μA or any other suitable current. In summary, the use of the capacitance and the discharge current that controls the charge and discharge time constants allows for the accumulation of a sufficient number of consecutive "1's" provided by SONET or other pseudo random signal formats to enable the peak and peak-to-peak values to be detected and provided to the dual feedback loops.

Use of fixed base current to simulate high resistance is described in reference to the specific circuit, however, it should be noted that it is applicable to any circuit where it is desirable to create a sufficiently long discharge time, especially when addition of a high value resistor to the circuit or large capacitance is undesirable.

V. Laser Driver Split Power Supply 2.5/3.3 Volt Feature

Figure 10:
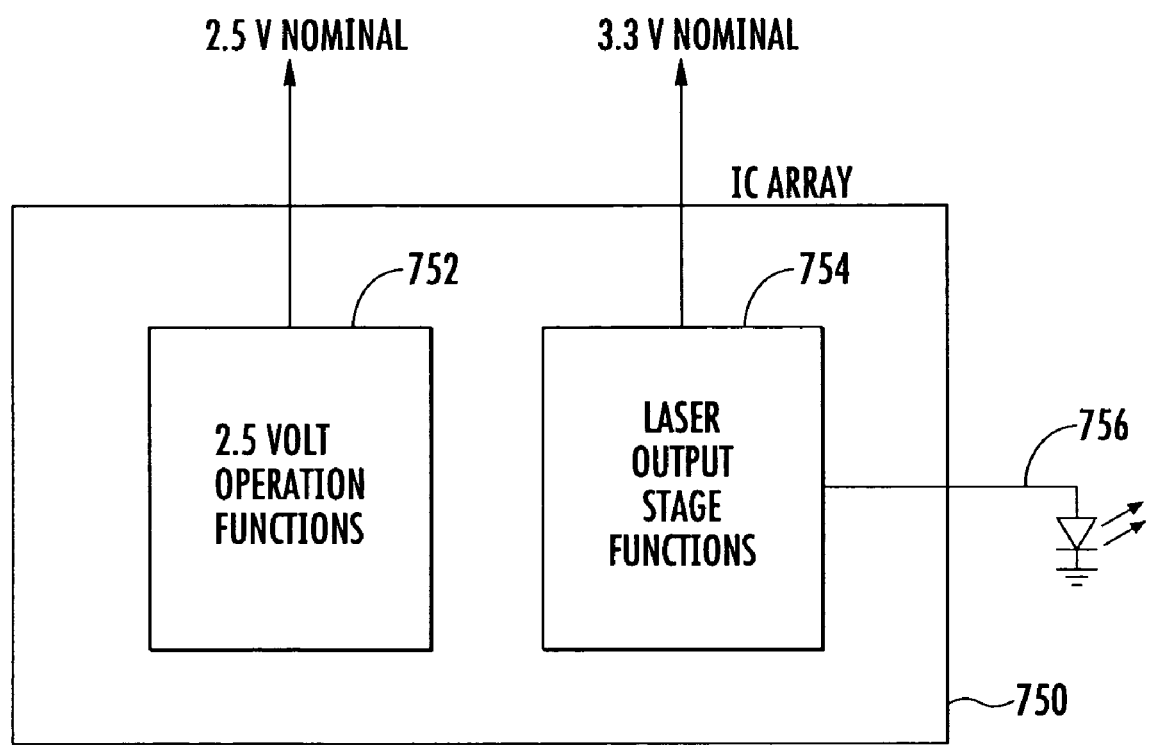
FIG. 10 is a generalized schematic block diagram showing a dual power supply according an embodiment of the present invention.

To further reduce power consumption, a dual power supply 750 may be used in one embodiment of the present invention, such as shown schematically in FIG. 10. Two power supplies, a 2.5 V power supply and a 3.3 V power supply, may be used to power various parts of the laser driver array, which may be implemented on an integrated circuit (IC). A power supply set at a nominal value of 3.3 volts, for example, is used to power laser output stage functions 754 to drive lasers 756, and a second power supply set at a lower voltage, for example 2.5 volts, is used to power other components 752 of the integrated circuit. The use of the 2.5 volt power supply in parts of the integrated circuit may reduce the overall power consumption of the integrated circuit.

Thus, use of the split power supply reduces power consumption by powering selected functions in the laser output stage with a 3.3 Volt supply voltage and remaining function with a 2.5 Volt supply. In other embodiments, an option to use either a single 3.3 Volt supply or a split power supply of 2.5/3.3 Volt may be allowed to a laser driver array integrated on a single IC. The power consumption is reduced when two supplies are used. The split power supply may be used in the laser driver array to reduce power consumption. The split power supply may also be used in any other circuit that may benefit from reduced power consumption due to such split power system.

VI. Low Off-Voltage Laser Driver for Longwave VCSELs

Longwave VCSELs may or may not have an off voltage, also referred to as a low voltage, that differs from those of typical shortwave VCSELs.

Figure 11:
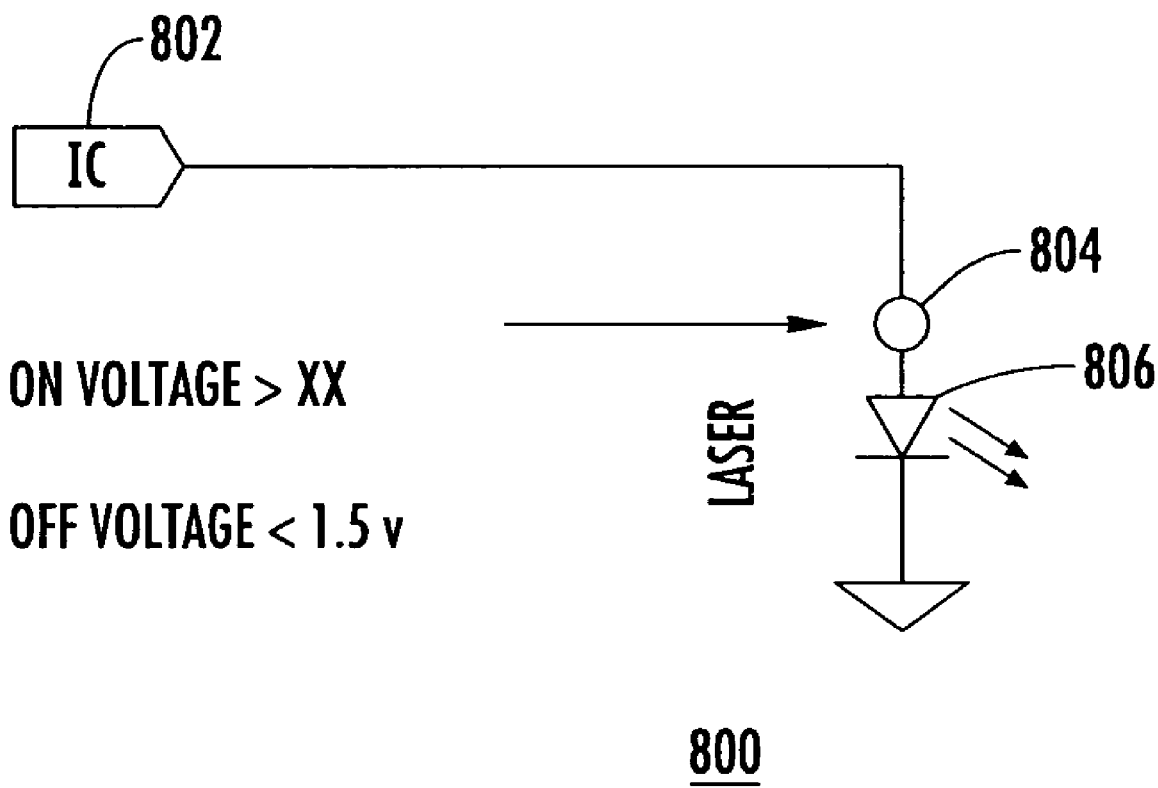
FIG. 11 is a simplified circuit diagram of a low off-voltage laser driver for longwave VCSELs according to an embodiment of the invention.

FIG. 11 is a simplified circuit diagram of a circuit 800 for driving a laser 806. The laser 806 may be a single VCSEL or it may represent an array of VCSELs. In the IC 802, power consumption may be altered by operating at voltage levels at the driving point 804 that are appropriate for the longwave VCSEL in question. Exemplary longwave VCSEL 806 has a low voltage, e.g., 1.5V or less, which is lower than the typical low voltage for an exemplary shortwave VCSEL. The circuit 800 allows direct current coupling with no AC coupling capacitor required, thus reducing PCB (printed circuit board) space requirements. The elimination of AC coupling reduces power consumption by eliminating losses in the capacitor. Those of ordinary skill in the art will appreciate that the low voltage of a particular longwave VCSEL may in fact be less than, comparable to or greater than that of a typical shortwave VCSEL, and that the circuits described herein may be used or modified in accordance with the voltages of the VCSEL in question.

Figures 12A, 12B:
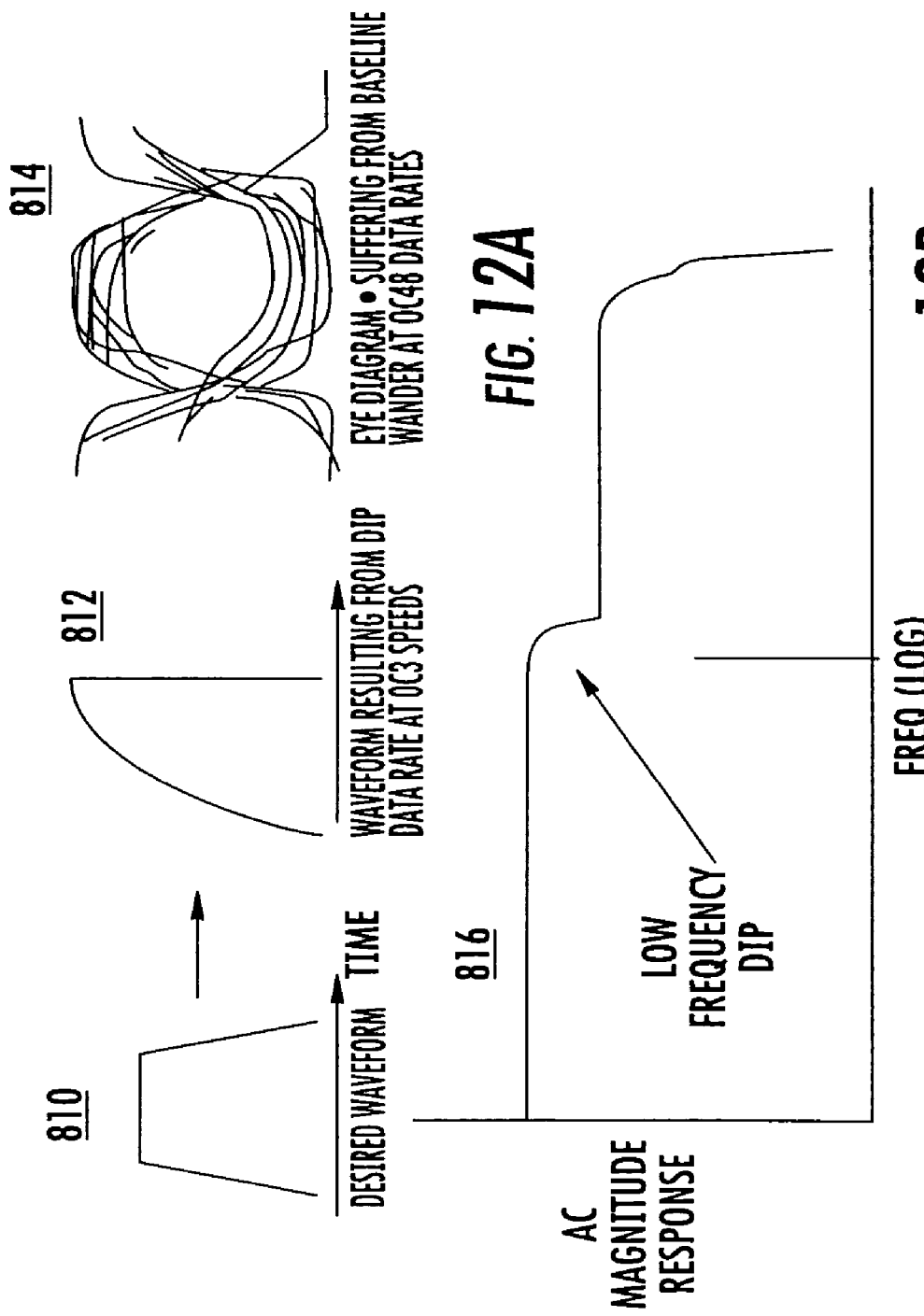
FIGS. 12A and 12B are graphical illustrations of pulse shaping and baseline wander problems as may be caused by a low frequency dip.

VII. Feedback to Reduce Baseline Wander and ISI (Inter Symbol Interference) for Low Bandwidth PNP Source One of the considerations that may be addressed in designing any data communication system is the shape of the waveform transmitted. A distorted waveform may not be detected correctly at the receiving end, thus resulting in error. FIG. 12A, for example, illustrates a desired waveform 810 for a data communication system, such as, for example, the optical communication system embodiment of the present invention.

When a PNP current mirror circuit having an NPN sink, such as the one that may be implemented with PNP transistors 824, 836 and NPN transistors 830, 838 of FIG. 13A, is used as a current source to drive the laser (e.g. 840) an undesirable low frequency dip may occur in an AC magnitude response. Such a frequency dip is illustrated in frequency response plot 816 of FIG. 12B. The low frequency dip may distort the waveforms. A waveform 812 of FIG. 12A illustrates such distorted waveform, for example, at an OC-3 data rate (155 Mbps). An eye diagram 814 of FIG. 12A suffers from baseline wander, for example, at an OC-48 data rate (2.5 Gbps) due to the low frequency dip.

The low frequency dip, such as the one in the frequency response plot 816, may be substantially flattened by adding a feedback resistor 862 to a PNP current mirror of the laser driver circuit, such as a laser driver circuit 860 of FIG. 13B. The resistance of the feedback resistor may be adjusted until a desired frequency response is achieved. The circuit may be applied to laser drivers including VCSELs. The feedback resistor may also be added to any driver, which uses a PNP current mirror source to drive a digital load, to substantially flatten the low frequency dip.

Additionally adding a series resistor-capacitor circuit as illustrated at 801 and 803 or 805 and 807 can lessen any deterministic jitter at the load 840 or 880. The resistor-capacitor circuit may have different values, which will vary depending on the circuit parameters. Typical values for resistor 801 0r 805 are between 100 and 300 ohms and typical values for capacitor 803 or 807 are between 0.5 to 3.0 picofarads. The values may be adjusted depending on implementation and circuit details. The deterministic jitter and need for the feedback resistor 822 may also be diminished by the placement of an inductor 809 between the collector of PNP transistor 836 and the junction of transistor 838 and the load 840.

It should be emphasized that the above-described embodiments are intended to be exemplary only. For example, the terms "laser" and "VCSEL" are used interchangeably to emphasize that the embodiments of the present invention may find application in optical systems using both VCSELs and other lasers. The laser array may include copy of various numbers of data lasers. Furthermore, the specific arrangement of the components of the integrated circuit and the details of the method generally covered by the integrated circuit, are exemplary only. The integrated circuit including the laser driver array of the present invention may be integrated into larger integrated circuits including other features, without departing from the scope and spirit of the inventive concepts disclosed herein. Further, the embodiments described herein may be useful for individual lasers as well as arrays.

What is claimed is:

1. An apparatus for driving a laser the apparatus comprising:
   a current sink;
   a differential pair of PNP transistors, each transistor having a base, emitter and collector the bases being coupled together, and the emitters being coupled to a supply voltage Vcc,
   a differential pair of NPN transistors, each transistor having a base, emitter and collector the emitters being joined at a junction with the current sink, the bases providing the input across which an input signal is developed,
   a load junction of the collector of one of the PNP transistors and one of the collectors of one of the NPN transistors that is coupled to a laser load;
   wherein the load junction is coupled to the base junction of the PNP transistors by a feedback resistor; and
   wherein the feedback resistor is coupled between the load junction and the base of a PNP feedback transistor, and the emitter of the PNP feedback transistor is coupled to the base junction of the PNP differential transistor pair.

2. The apparatus of claim 1 wherein the load junction is further coupled to a first end of a series resistor-capacitor circuit and the second end of the series resistor-capacitor circuit is coupled to ground.

3. The apparatus of claim 1 wherein the load junction is further coupled to a first end of a series resistor-capacitor circuit and the second end of the series resistor-capacitor circuit is coupled to a power supply.

4. The apparatus of claim 1 further comprising an inductor disposed between the load junction and the load.

* * * * *